United States Patent [19]

Ikeda et al.

[11] 4,190,949
[45] Mar. 4, 1980

[54] METHOD FOR MANUFACTURING A SEMICONDUCTOR DEVICE

[75] Inventors: Masashi Ikeda; Kazuo Kihara, both of Tokyo, Japan

[73] Assignee: Tokyo Shibaura Denki Kabushiki Kaisha, Kawasaki, Japan

[21] Appl. No.: 960,644

[22] Filed: Nov. 14, 1978

[30] Foreign Application Priority Data

Nov. 14, 1977 [JP] Japan .............................. 52/135752
Nov. 14, 1977 [JP] Japan .............................. 52/135753
Nov. 14, 1977 [JP] Japan .............................. 52/135754

[51] Int. Cl.$^2$ ............................................. H01L 21/22
[52] U.S. Cl. ...................................... 29/571; 148/175; 148/187; 357/34
[58] Field of Search ................... 148/187, 145; 357/34

[56] References Cited

U.S. PATENT DOCUMENTS 3,796,613  3/1974  Magdoo et al. ...................... 148/175

OTHER PUBLICATIONS

Davies et al., 1977 I.E.E.E. International Solid-State Circuits Conference, Feb. 18, 1977, pp. 218–220.
Sakai et al., "Bipolar Transistor of Novel Construction," 25th Lecture Meeting on Technology in Applied Physics, Japan, 1978.

Primary Examiner—G. Ozaki
Attorney, Agent, or Firm—Finnegan, Henderson, Farabow, Garrett & Dunner

[57] ABSTRACT

Disclosed is a method for manufacturing a semiconductor device which comprises the steps of forming a first insulating film on a semiconductor substrate of one conductivity type which forms a collector region, boring an opening through the first insulating film to expose part of the substrate, forming a semiconductor layer on the exposed surface of the substrate and the first insulating film, forming a base-collector junction by introducing an impurity of the other conductivity type into the semiconductor layer, selectively removing the semiconductor layer to leave a semiconductor region consecutively connected to the exposed surface on the first insulating film, covering the semiconductor region with a second insulating film, and boring an opening through the second insulating film and introducing through the opening an impurity of the one conductivity type into the semiconductor region, whereby an emitter region is formed.

In the aforementioned method, there is further provided a step for laminating the first insulating film with an insulating layer or a polycrystalline semiconductor layer containing an impurity of the otherconductivity type directly after the step for forming the first insulating film.

5 Claims, 20 Drawing Figures

METHOD FOR MANUFACTURING A SEMICONDUCTOR DEVICE

This invention relates to a method for manufacturing a semiconductor device, more specifically to a method capable of reducing the area covered by active elements, such as transistors, in an integrated circuit device.

Before describing the invention, there will now be described for the sake of comparison a prior art method for manufacturing a transistor with reference to FIGS. 1 to 4.

FIG. 1: Formation of isolation regions and collector leading region in substrate A basic structure formed of a p-type silicon substrate 1 with an n-type buried layer 2A embedded therein and an n-type epitaxial layer 3 forming a collector region has its exposed main surface covered with an insulating film 4. After an opening is formed in the insulating film 4 at a desired portion thereof by photoetching, a p-type impurity is selectively diffused into the epitaxial layer 3 to form isolation regions 1A connected to the substrate 1. Then, after an opening is formed in the insulating film 4 at another portion thereof, an n-type impurity is selectively diffused to provide a collector leading region 2B connected to the buried layer 2A and tending to reduce together therewith the resistance of the collector region.

FIG. 2: Formation of base region

An opening is bored through the insulating film 4 at a portion where a base region is to be formed, and a base region 5 is formed by diffusing a p-type impurity through such opening. The exposed surface of the formed base region is covered with an insulating film 4A of $SiO_2$.

FIG. 3: Formation of emitter region

Openings are bored, respectively, in the insulating film 4A over the base region 5 at a portion where an emitter region is to be formed, and in part of the collector leading region 2B, and an emitter region 6 and a collector electrode contact region 2C are formed by diffusing n-type impurities through these openings.

FIG. 4: Formation of electrode for each region

Openings for leading out the collector, base, and emitter regions are formed in the insulating film, a metal layer is ohmic-connected to these individual regions at the openings and patterned into a predetermined shape, and thus a collector electrode 7, base electrode 8, and an emitter electrode 9 are formed.

In the above-mentioned example of the prior art transistor, the area (S1) covered by unit transistors separately formed by the isolation regions cannot be reduced because the inter-electrode space is determined by the masking accuracy (accuracy in base shape, patterning for the formation of the electrode metal layer, etc.). That is, the area covered is large, so that the parasitic capacity may not be reduced. Accordingly, there has been an urgent demand for the improvement in performance of the transistor as an IC element for superspeed logical operation and ultrahigh-frequency operation.

An object of this invention is to provide a method for manufacturing a semiconductor device capable of substantially reducing the area covered by active elements in an IC, and thence of compaction.

Another object of the invention is to provide a method for manufacturing a semiconductor device capable of substantially reducing the base-collector junction capacity of transistors in an IC, and thence of improving electrical characteristics of the IC, such as superspeed logical operation, ultrahigh-frequency operation, etc.

According to the invention, there is provided a method for manufacturing a semiconductor device which comprises the steps of forming a first insulating film on a semiconductor substrate of one conductivity type; boring an opening through the first insulating film to expose part of the substrate; forming a semiconductor layer of the other conductivity type on the exposed surface of the substrate and the first insulating film; selectively removing the semiconductor layer to leave a semiconductor region consecutively connected to the exposed surface on the first insulating film; covering the semiconductor region with a second insulating film; boring an opening through the second insulating film and introducing through the opening an impurity of the other conductivity type into the semiconductor region; and forming takeout electrodes on the semiconductor region and the semiconductor substrate.

According to a preferred embodiment of the invention, the above-mentioned method may further include a step of laminating the first insulating film with an insulating layer containing an impurity of the other conductivity type or a polycrystalline semiconductor layer containing an impurity of the other conductivity type at high concentration directly after the step for forming the first insulating film.

The invention itself both as to organization and operation together with further objects and advantages thereof may best be understood by references to the following description taken in conjunction with the drawings in which.

Referring now to FIGS. 5 to 9, there will be described a method for manufacturing a semiconductor device according to a first embodiment of this invention.

Figure 5:
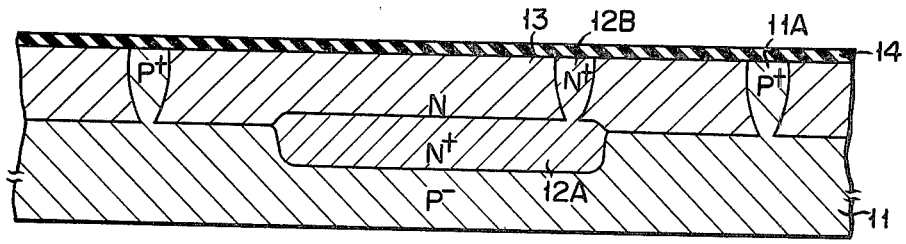
FIGS. 5 to 9 are sectional views showing an embodiment of the method for manufacturing a semiconductor device of this invention in a process sequence.

A basic structure formed of a p-type silicon substrate 11 with an n-type buried layer 12A embedded therein and an n-type epitaxial layer 13 forming a collector region has its exposed main surface covered with a first insulating film 14 of $SiO_2$. A p-type impurity is selectively diffused into the epitaxial layer 13 to form isolation regions 11A to be connected to the substrate 11, and then an n-type impurity is selectively diffused to form a collector leading region 12B to be connected to the buried layer 12A (FIG. 5).

Figure 6:
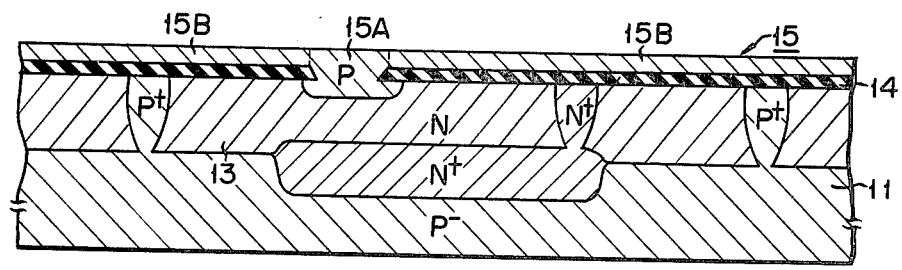

In the first insulating film 14, an opening corresponding to the plane shape of its effective base region is formed, and the opening and the insulating film 14 are covered with an n-type vapor growth layer 15 (FIG. 6). The n-type vapor growth layer 15 is formed for the following reason. That is, part of the n-type vapor growth layer 15 is to form a p-type base region in a later process. In general, it is to be desired that the base region of a transistor should have high resistance, that is, low conductivity. Therefore, it may be considered advantageous to form a low-conductivity p-type vapor growth layer from the beginning instead of forming the n-type vapor growth layer 15. Practically, however, it is difficult to form a vapor growth layer with the desired conductivity in accordance with vapor growth method. Accordingly, this embodiment employs a method whereby a p-type base region with the desired conductivity is formed by diffusing a p-type impurity into the n-type vapor growth layer 15 in a later process after forming the layer 15. As is conventionally known, this method enables accurate control of conductivity.

In the vapor growth of the layer 15, the portion of the layer 15 grown over the exposed surface of the n-type epitaxial layer 13 at the opening becomes a single-crystal silicon layer 15A, while the portion over the insulating film 14 grows simultaneously into a polycrystalline silicon layer 15B. In practice, the vapor growth layer 15 is formed by thermal decomposition of silane (monosilane $SiH_4$) with the substrate temperature at 950° C. or more or by reduction of silicon tetrachloride ($SiCl_4$) at 1,100° C. or more. The difference in level around the opening based on the thickness (e.g., 5,000 Å.) of the insulating film 14 is caused because the growth speed of the single-crystal silicon layer is higher as compared with the polycrystalline silicon layer when the crystal plane of the n-type epitaxial layer 13 is "100". If the crystal plane is "111", however, the growth speeds of the two layers are hardly different from each other. Thus, it is easy to form a smooth exposed surface of the vapor growth layer 15, taking advantage of the difference between these growth speeds. The smooth exposed surface will enable repeated fine photo-etching in a later process. Then a p-type impurity is diffused into the vapor growth layer 15 for the formation of the base region. By such impurity diffusion, the conductivity type of the polycrystalline silicon layer 15B is changed from p- to n-type, and the impurity diffused in the single-crystal silicon layer 15A is diffused also into the downward epitaxial layer 13, forming a satisfactory base-collector junction.

Figure 7:
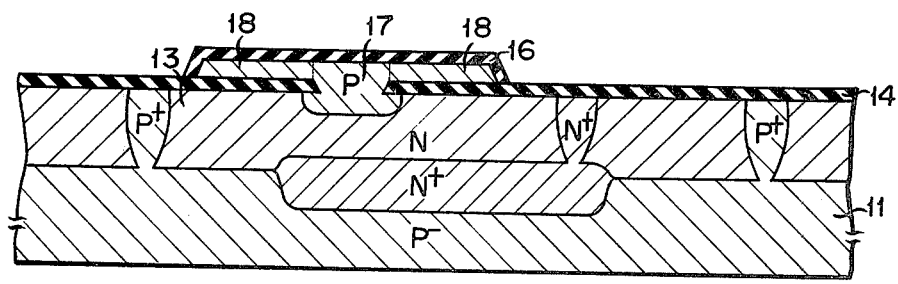

As shown in FIG. 7, after patterning into an insular form by photo-etching, the vapor growth layer 15 is covered with a second insulating film 16. The island size is determined in consideration of the relation between an emitter region and a base electrode formed later. Numerals 17 and 18 designate an effective base region formed of single crystal and a polycrystalline conductive region for leading out the base region, respectively.

Figure 8:
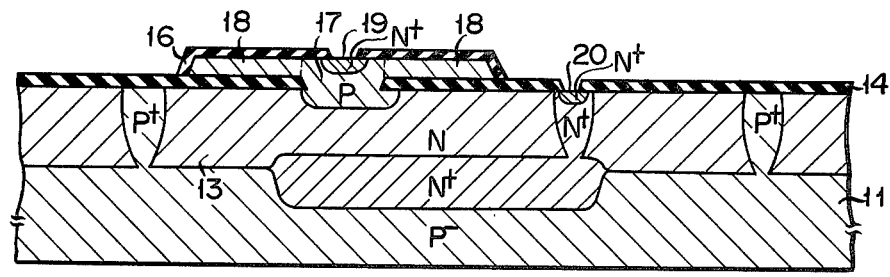

Openings are bored, respectively, in the second insulating film 16 at a portion where an emitter region is to be formed, and in the first insulating film 14 at a portion where a collector contact region is to be formed, and respective diffusion regions are formed by diffusing an n-type impurity through these openings at high concentration (FIG. 8). In FIG. 8, numerals 19 and 20 denotes emitter and collector contact regions respectively.

Figure 9:
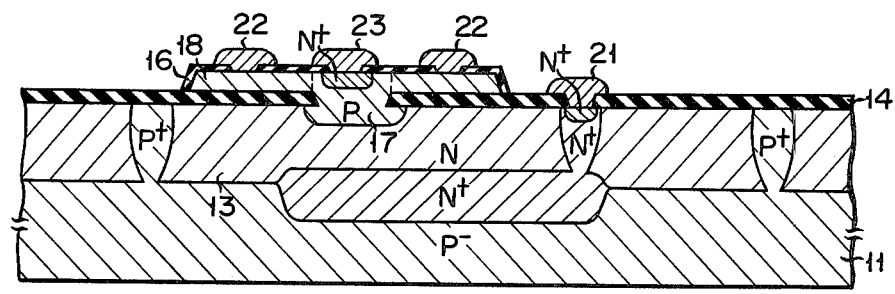

Openings for leading out the collector contact region 20, base region 17 and emitter region 19 are formed in the first and second insulating films, a metal layer is ohmic-connected to these individual regions at the openings and patterned into a predetermined shape, and thus a collector electrode 21, base electrode 22, and an emitter electrode 23 are formed (FIG. 9).

Now there will be described a second embodiment of the invention with reference to FIGS. 10 to 14, in which like reference numerals refer to the same parts as those described in connection with the first embodiment.

Figure 10:
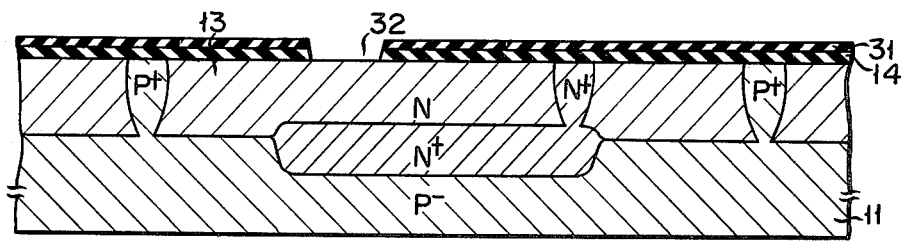
FIGS. 10 to 14 are sectional views showing another embodiment of the method of the invention.

First, just the same structure of FIG. 5 is prepared. The first insulating film 14 of this structure is laminated with a second insulating film 31 doped with a p-type impurity. Then an opening 32 is bored by photo-etching through the first and second insulating films 14 and 31 at the portion where the base region is to be formed, whereby part of the epitaxial layer 13 is exposed (FIG. 10).

Figure 11:
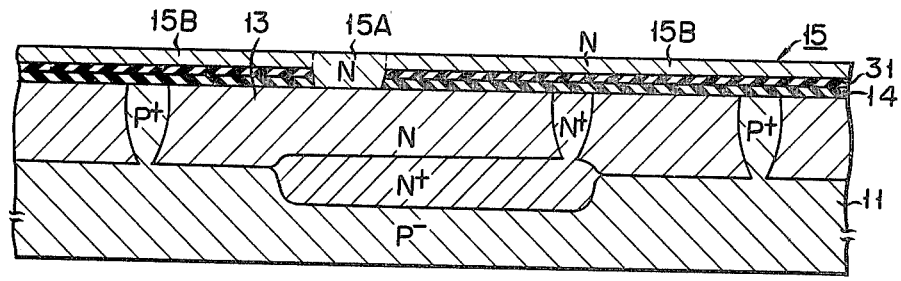

The opening 32 and the second insulating film 31 are covered with the n-type vapor growth silicon layer 15. As a result, the vapor growth layer 15A grown over the exposed surface of the n-type epitaxial layer 13 is composed of single-crystal silicon, whereas the vapor growth layer 15B grown over the second insulating film 31 is formed of polycrystalline silicon (FIG. 11).

Figure 12:
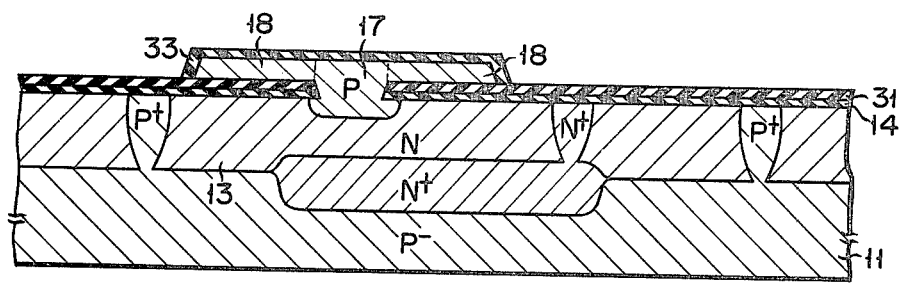

Subsequently, in order to form the base region, a p-type impurity is diffused into the n-type vapor growth layer 15 from the outside. By such impurity diffusion, the conductivity type of the polycrystalline silicon layer 15B is changed from p- to n-type, and the impurity diffused in the single-crystal silicon layer 15A is diffused also into the downward epitaxial layer 13, forming a satisfactory base-collector junction (not shown). In doing this, the p-type impurity with which the second insulating film 31 is doped is diffused therefrom into the upward polycrystalline silicon layer 15B, but not into the single-crystal silicon layer 15A. That is, the single-crystal silicon layer 15A which later functions as the effective base region is given the conductivity only by the externally introduced p-type impurity, while the polycrystalline silicon layer 15B which later serves as the conductive region for leading out the base region is given the conductivity by both the externally introduced p-type impurity and the p-type impurity delivered from the second insulating film 31. Therefore, the effective base region and the base leading conductive region will acquire higher and lower resistances respectively, providing ideal transistor characteristics. As shown in FIG. 12, after an island composed of the p-type base region 17 of single-crystal silicon and the low-resistance p-type base region leading conductive region 18 of polycrystalline silicon is formed by selectively removing the vapor growth layer 15 by photo-etching, the surface of such island is covered with a third insulating film 33.

Figure 13:
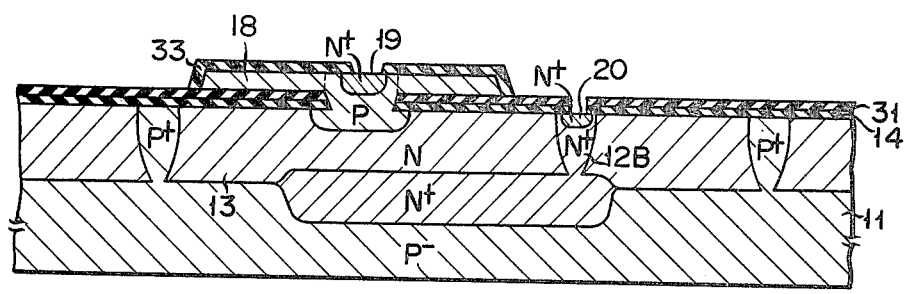

An opening to expose the single-crystal silicon base region 17 is formed by selectively removing the third insulating film 33, and another opening passing through the first and second insulating films 14 and 31 to expose the collector leading region 12B is formed. An n-type impurity is diffused through these openings at high concentration, whereby the emitter region 19 and the collector contact region 20 are severally formed (FIG. 13).

Figure 14:
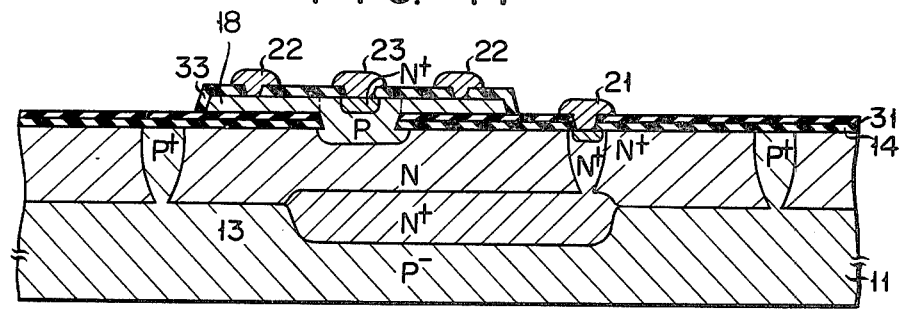

The collector electrode 21, base electrode 22, and the emitter electrode 23 are separately formed in the same manner as the aforementioned first embodiment (FIG. 14).

Now there will be described a third embodiment of the invention with reference to FIGS. 15 to 19, in which like reference numerals refer to the same parts as those described in connection with the first and second embodiments.

Figure 15:
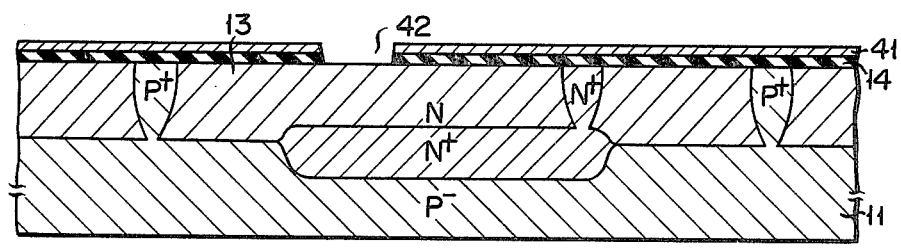
FIGS. 15 to 19 are sectional views showing still another embodiment of the method of the invention.

First, substantially the same structure of FIG. 5 is prepared. The first insulating film 14 of this structure is laminated with a polycrystalline silicon layer 41 doped with a p-type impurity at high concentration. Then an opening 42 is bored by photo-etching through the first insulating film 14 and the polycrystalline silicon layer 41, whereby part of the n-type epitaxial layer 13 is exposed (FIG. 15).

Figure 16:
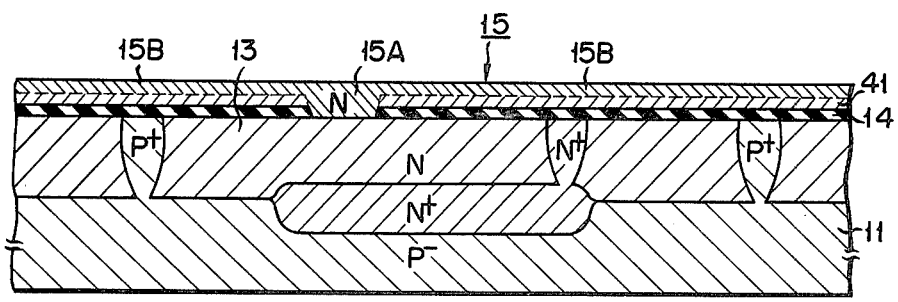

The opening 42 and the doped polycrystalline silicon layer 41 are covered with the n-type vapor growth silicon layer 15. As a result, the vapor growth layer 15A grown over the exposed surface of the n-type epitaxial layer 13 at the opening 42 is composed of single-crystal silicon, whereas the vapor growth layer 15B grown over the doped polycrystalline silicon layer 41 is formed of polycrystalline silicon (FIG. 16).

Figure 17:
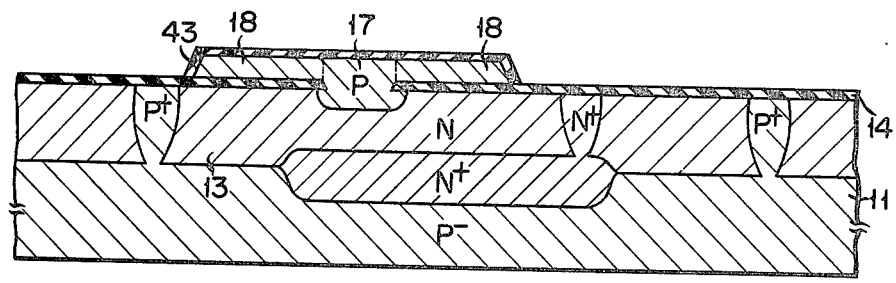

Subsequently, in order to form the base region, a p-type impurity is diffused into the n-type vapor growth layer 15 from the outside. By such impurity diffusion, the conductivity type of the polycrystalline silicon layer 15B is changed from p- to n-type, and the impurity diffused in the single-crystal silicon layer 15A is diffused also into the downward epitaxial layer 13, forming a satisfactory base-collector junction (not shown). In doing this, the p-type impurity with which the doped polycrystalline silicon layer 41 is doped is diffused therefrom into the upward polycrystalline silicon layer 15, but not into the single-crystal silicon layer 15A. That is, the single-crystal silicon layer 15A which later functions as the effective base region is given the conductivity only by the externally introduced p-type impurity, while the polycrystalline silicon layer 15B which later serves as the conductive region for leading out the base region is given the conductivity by both the externally introduced p-type impurity and the p-type impurity delivered from the doped polycrystalline silicon layer 41. Therefore, the effective base region and the base leading conductive region will acquire higher and lower resistances respectively, providing ideal transistor characteristics. If the polycrystalline silicon layer 41 does not exist, there may be caused a disconnection between the single-crystal silicon layer 15A and the polycrystalline silicon layer 15B at the edge of the opening 42. According to the third embodiment, however, such undesirable disconnection will never be caused because the single-crystal silicon layer 15A grown inside the opening 42 is satisfactorily connected with the doped polycrystalline silicon layer 41 in the course of its growth. The doped polycrystalline silicon layer 41 serves also as a crystalline germ for the polycrystalline silicon layer 15B formed thereon. As shown in FIG. 17, after an island composed of the p-type base region 17 of single-crystal silicon and the low-resistance p-type base region leading conductive region 18 of polycrystalline silicon is formed by selectively removing the vapor growth layer 15 by photo-etching, the surface of such island is covered with a second insulating film 43.

Figure 18:
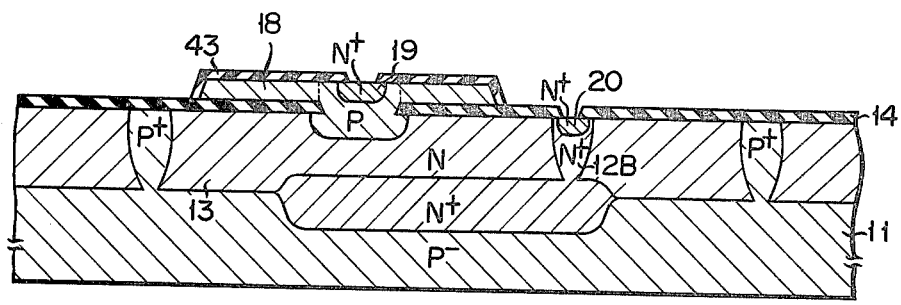

An opening is formed in the second insulating film 43 to expose the p-type base region 17, and another opening is bored in the first insulating film to expose the collector leading region 12B. An n-type impurity is diffused through these openings at high concentration, whereby the emitter region 19 and the collector contact region 20 are respectively formed (FIG. 18).

Figure 19:
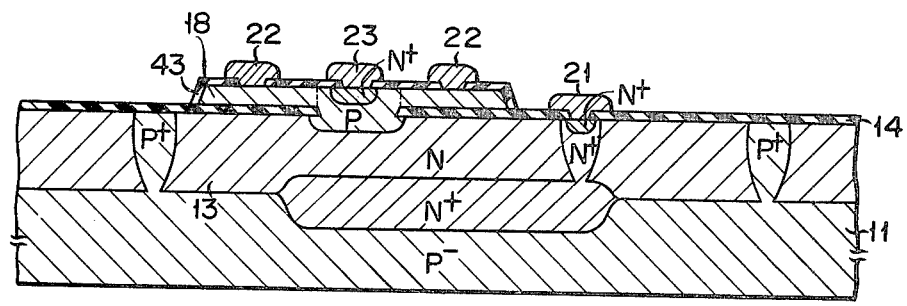

Finally, the collector electrode 21, base electrode 22, and the emitter electrode 23 are separately formed in the same manner as the aforementioned first embodiment (FIG. 19).

Figure 1:
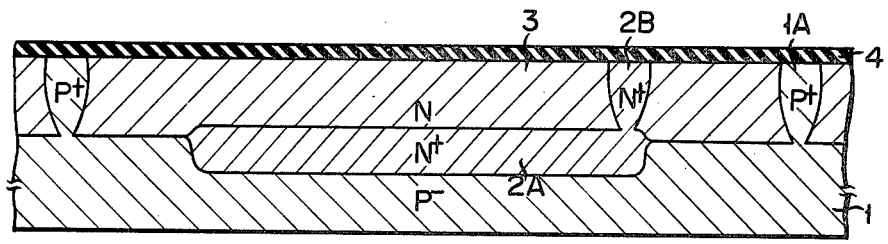
FIGS. 1 to 4 are sectional views showing a prior art method for manufacturing a semiconductor device in a process sequence.
Figure 2:
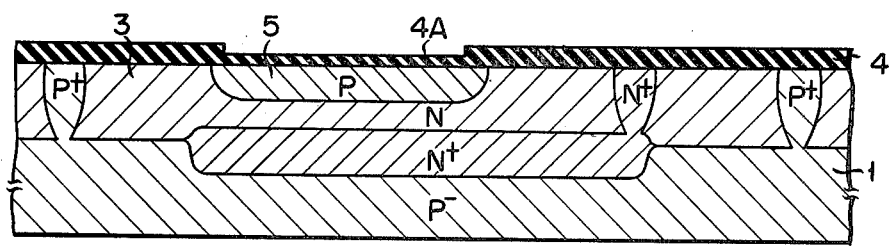
Figure 3:
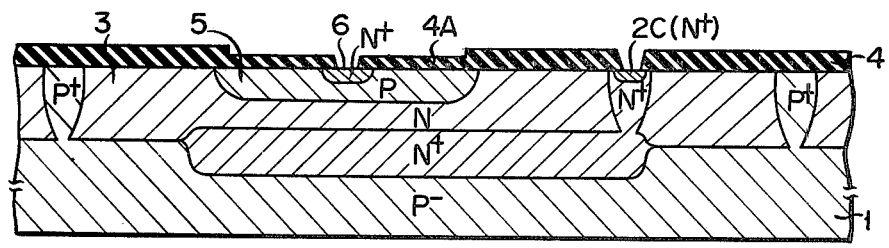
Figure 4:
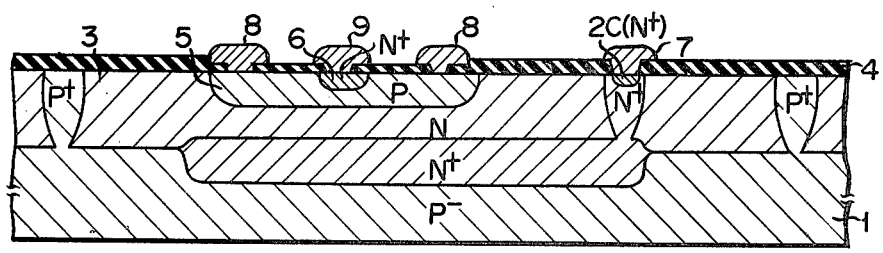
Figure 20:
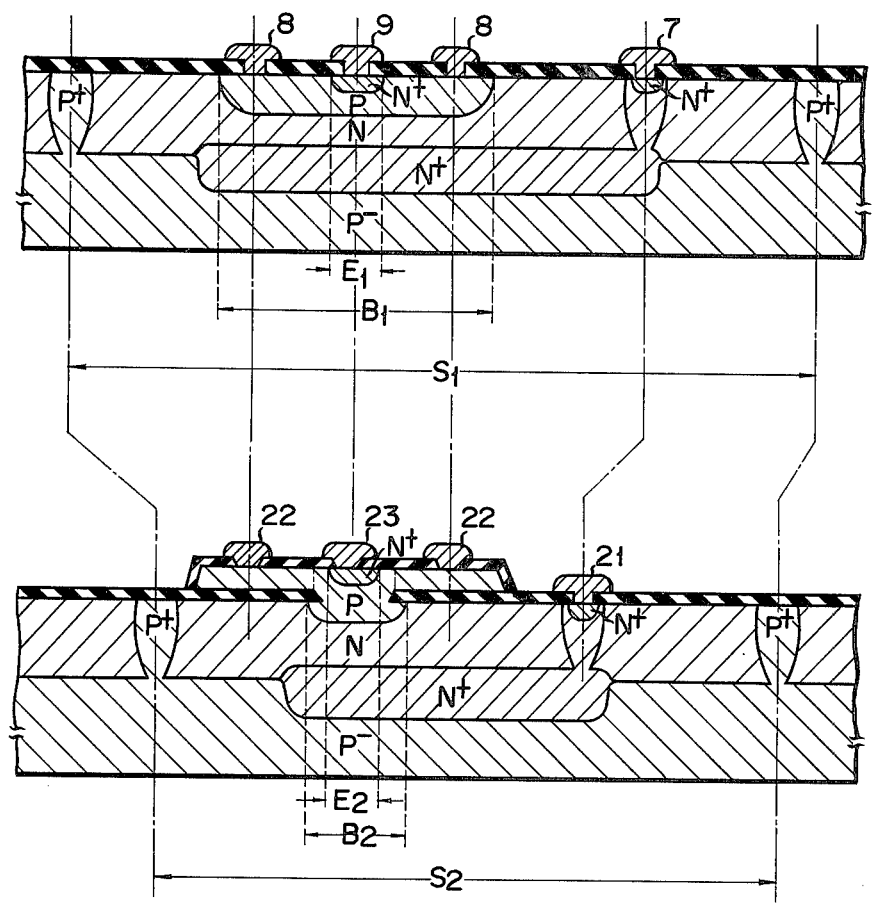
FIG. 20 is a sectional view for comparing the constructions of transistors manufactured severally by the prior art method and the method of the invention.

FIG. 20 is a sectional view for comparing the transistor formed by the method of the invention as described above with the transistor formed according to the prior art method. In FIG. 20, the upper transistor is identical with the one formed by the prior art method as shown in FIG. 4, while the lower one is identical with the one formed according to the first embodiment of the invention as shown in FIG. 9, each corresponding part being tied with a chain line.

According to this invention, the dimension $B_2$ required for the base region may be set at any width that covers the width $E_2$ for the emitter region plus the allowance for photo-mask alignment. If the emitter width $E_2$ is set at 2 $\mu$m, for example, the base width $B_2$ may be as short as 4 to 6 $\mu$m. On the other hand, the prior art method requires much wider base region dimension $B_1$ as compared with the emitter width $E_2$, because wiring electrodes need be patterned.

Thus, according to the method of the invention, the area covered by the unit transistor may be reduced from $S_1$ to $S_2$ ($S_1 > S_2$) without changing the relation $B_2 < B_1$ and the inter-electrode spaces, since the base region is composed of the single-crystal silicon layer region 17 forming the effective base region and the polycrystalline silicon layer region 18 for leading out the region 17, and the base region is connected with the epitaxial layer 13 forming part of the collector region only at the effective base region, the remaining portion of the base region being electrically insulated by the insulating film (first insulating film 14).

Moreover, the emitter area of the transistor according to the invention may be the same as that of the conventional transistor, so that the current capacity for the transistor may be kept at the same level. Since the base-collector junction capacity may substantially be reduced as aforesaid, the resultant transistor may enjoy a high cut-off frequency $f_T$. For example, the transistor obtained by the method of the invention may operate at 1,500 MHz or higher, whereas the prior art transistor can normally operate only within a range of 100 to 1,000 MHz. Furthermore, the very area covered by the unit transistor may be reduced correspondingly to the reduction of the base region area, so that there may be realized compaction as well as speed-up in operation.

What we claim is:

1. A method for manufacturing a semiconductor device comprising the steps of forming a first insulating film on a semiconductor substrate of one conductivity type; boring an opening through said first insulating film to expose part of said substrate; forming a semiconductor layer of the other conductivity type on the exposed surface of said substrate and said first insulating film; selectively removing said semiconductor layer to leave a semiconductor region consecutively connected to said exposed surface on said first insulating film; covering said semiconductor region with a second insulating film; boring an opening through said second insulating film and introducing through said opening an impurity of said one conductivity type into said semiconductor region; and forming electrodes on said semiconductor region and said semiconductor substrate.

2. A method for manufacturing a semiconductor device comprising the steps of forming a first insulating film on a semiconductor substrate of one conductivity type which forms a collector region; boring an opening through said first insulating film to expose part of said substrate; forming a semiconductor layer on the exposed surface of said substrate and said first insulating film; forming a base-collector junction by introducing an impurity of the other conductivity type into said semiconductor layer; selectively removing said semiconductor layer to leave a semiconductor region consecutively connected to said exposed surface on said first insulating film; covering said semiconductor region with a second insulating film; and boring an opening through said second insulating film and introducing through said opening an impurity of said one conductivity type into said semiconductor region, whereby an emitter region is formed.

3. A method according to claim 1 or 2 further comprising a step of laminating said first insulating film with an insulating layer containing an impurity of said other conductivity type directly after said step of forming said first insulating film.

4. A method according to claim 1 or 2 further comprising a step of laminating said first insulating film with a polycrystalline semiconductor layer containing an impurity of said other conductivity type at high concentration directly after said step of forming said first insulating film.

5. A method according to claim 1 or 2, wherein said semiconductor substrate comprises an epitaxial layer, and said semiconductor layer comprises a vapor growth layer.

* * * * *